United States Patent [19]
Casper

[11] Patent Number: 6,141,270
[45] Date of Patent: Oct. 31, 2000

[54] METHOD FOR CELL MARGIN TESTING A DYNAMIC CELL PLATE SENSING MEMORY ARCHITECTURE

[75] Inventor: Stephen L. Casper, Boise, Id.

[73] Assignee: Micron Technology, Inc., Boise, Id.

[21] Appl. No.: 09/070,520

[22] Filed: Apr. 29, 1998

[51] Int. Cl.[7] ..................................................... G11C 7/00
[52] U.S. Cl. ......................... 365/201; 365/149; 365/205
[58] Field of Search ................................... 365/201, 149, 365/205

[56] References Cited

U.S. PATENT DOCUMENTS

| | | | |
|---|---|---|---|
| 5,383,150 | 1/1995 | Nakamura et al. | 365/145 |
| 5,459,684 | 10/1995 | Nakamura et al. | 365/149 |
| 5,500,824 | 3/1996 | Fink | 365/201 |
| 5,943,276 | 8/1999 | Casper | 365/201 |
| 5,959,913 | 9/1999 | Raad | 365/201 |

OTHER PUBLICATIONS

"DRAMS in the 21$^{st}$ Century" Organizer: Satoshi Shinozaki, 1996 IEDM Short Course.

ISSCC94/Session 8/DRAMS and Non–volatile Memories/Paper TA8.2 "A 34ns 256Mb DRAM with Boosted Sense–Ground Scheme" pp. 106, 140.

"Half–$V_{DD}$ Bit–Line Sensing Scheme in CMOS DRAMS's" by Nicky Chau–Chun Lu, Journal of Solid–State Circuits, vol. SC–19, No. 4, Aug. 1984.

"A 250m V Bit–Line Swing Scheme for a 1V 4Gb DRAM" 1995 Symposium on VLSI Circuits Digest of Technical Papers, pp. 99–100.

"Cell–Plate Line Connecting Complementary Bitline ($C^3$) Archtecture for Battery Operating DRAMS" LSI Research and Development Laboratory, Mitsubishi Electric Corporation, pp. 59,60.

IEEE Journal of Solid–State Circuits, vol. 27, No. 4, Apr. 1992: Cell–Plate Line Connecting Complementary Bit–Line ($C^3$) Architecture for Battery–Operating DRAM's.

"Cell–Plate–Line and Bit–Line Complementarily Sensed (CBCS) Architecture for Ultra Low–Power Non–Destructive DRAMs",1995 Sym. On VLSI Circuits Digest of, Mitsubishi Electric Corporation, pp. 79,80.

*Primary Examiner*—Huan Hoang
*Attorney, Agent, or Firm*—Schwegman, Lundberg, Woessner & Kluth, P.A.

[57] ABSTRACT

A cell margin test method for a dynamic cell plate sensing (DCPS) memory array. In a DCPS memory array, voltage moves on both a digitline and a cell plate line associated with an accessed memory cell. Voltage movement on the digitline and its associated cell plate line is in opposite directions, ie., voltage on one line moves up (goes high) and voltage on the other line moves down (goes low). Because voltage movement is in opposite directions, this produces a voltage swing which is larger than that produced by a conventional digitline pair approach, in which one digitline remains at a reference potential and the other digitline moves away from the reference potential. A method is provided for a DCPS memory array which tests sense amplifier latching with a voltage swing produced with one line (either a digitline or a cell plate line) held at a reference potential and another line (either a digitline or a cell plate line) moved away from the reference potential.

20 Claims, 3 Drawing Sheets

METHOD FOR CELL MARGIN TESTING A DYNAMIC CELL PLATE SENSING MEMORY ARCHITECTURE

TECHNICAL FIELD OF THE INVENTION

The present invention relates generally to memory cell margin testing, and more particularly to testing sense amplifier operability in conjunction with an array of dynamic cell plate sensed memory cells.

BACKGROUND OF THE INVENTION

Memory devices comprise an array of memory cells. Wordlines (row lines) and digitlines (column lines or bitlines) are employed to access memory cells of a memory array.

In a conventional memory array, for a read operation digitlines are electrically disconnected from a bias voltage and allowed to float. The digitlines remain for a sufficient time at a precharge voltage owing to their capacitance. Voltage on a wordline is then increased to digitline precharge voltage plus at least a threshold voltage amount to access a memory cell. Once accessed, a memory cell capacitor begins to discharge onto an associated digitline, in which case digitline voltage on the accessed line is either increased or decreased depending on the presence or absence of charge stored in the accessed memory cell. This change in voltage, owing to charge sharing, is conventionally compared against a reference digitline floating at the precharge voltage.

After a memory cell is accessed, sensing the voltage differential is sensed. Digitlines are connected to a sense amplifier for sensing a voltage difference between two digitlines, namely, the digitline accessed and its reference line. However, as voltage logic levels are decreased owing to decreases in memory cell size, voltage swings are reduced accordingly. A smaller voltage swing, in combination with transistor threshold voltages, renders sense amplifiers voltage margin limited.

To address lower voltage levels, an architecture has been proposed, which has been referred to as "dynamic cell plate sensing" or "DCPS." In a DCPS array, a plate line is connected to a memory cell's capacitor cell plate. Plate lines and associated digitlines are maintained at a precharge voltage level (e.g., Vcc/2) prior to a read operation. For a read operation, these lines are allowed to float just prior to wordline firing. Voltages on an accessed digitline and its associated plate line move in opposite directions owing to cell capacitor charges moving in opposite directions when accessed. This provides for a larger voltage swing for sensing operations.

Conventional margin testing of a DCPS cell of necessity tests voltage movement of both the accessed digitline and its associated plate line. However, it would be desirable to provide a cell margin test which tests voltage movement on an individual digitline or plate line against a reference potential to provide a more accurate indication of margin. Such a test would provide a better indication of cell margin limitations on each line.

SUMMARY OF THE INVENTION

The present invention provides a method for testing cell margin for a memory cell in a dynamic cell plate sensing array architecture. For cell margin testing, memory cell charge transfer (including either charge addition or depletion) to a digitline or plate line takes place. Prior to charge transfer, an isolation device is turned off to selectively isolate either a digitline or a plate line associated with the accessed memory cell. The selected digitline or plate line is isolated from a sense amplifier. The non-selected line is coupled to the sense amplifier during memory cell charge transfer. This results in voltage movement or swing at a sense amplifier sense node in electrical communication with the accessed memory cell and no, or no significant, voltage movement at another sense amplifier sense node not in electrical communication with the accessed memory cell. The isolated sense node thus floats at an equilibrate potential. Consequently, a voltage difference is created between the two sense amplifier nodes, permitting cell margin testing for sense amplifier latching with respect to voltage movement on either a plate line or a digitline.

Therefore, the present invention provides cell margin testing of a memory cell in a DCPS array architecture on one of two lines at a time, namely, either a cell plate line or a digitline. Moreover, because voltage movement occurs at only one sense node of a sense amplifier and an opposite sense node stays at or near a reference potential, a direct comparison of sense amplifier operation data in a DCPS environment may be made with data from a sense amplifier operating in a non-DCPS environment.

BRIEF DESCRIPTION OF THE DRAWING(S)

Features and advantages of the present invention will become more apparent from the following detailed description of the preferred embodiment(s) described below in detail with reference to the accompanying drawings where:

Figure 1A:
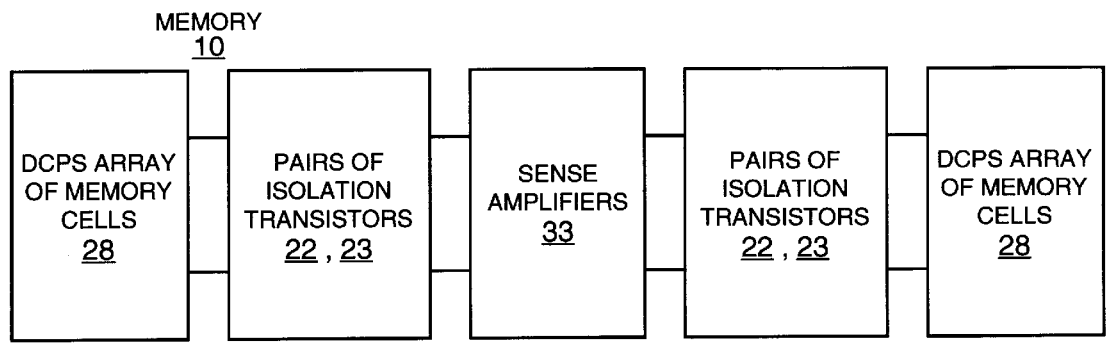
FIG. 1A is a block diagram of an exemplary portion of an embodiment of a memory of the prior art.

Reference numbers refer to the same or equivalent parts of the present invention throughout the several figures of the drawing.

DETAILED DESCRIPTION OF THE PREFERRED EMBODIMENT(S)

To more clearly describe the present invention, a more detailed description of the prior art is provided.

Figure 1B:
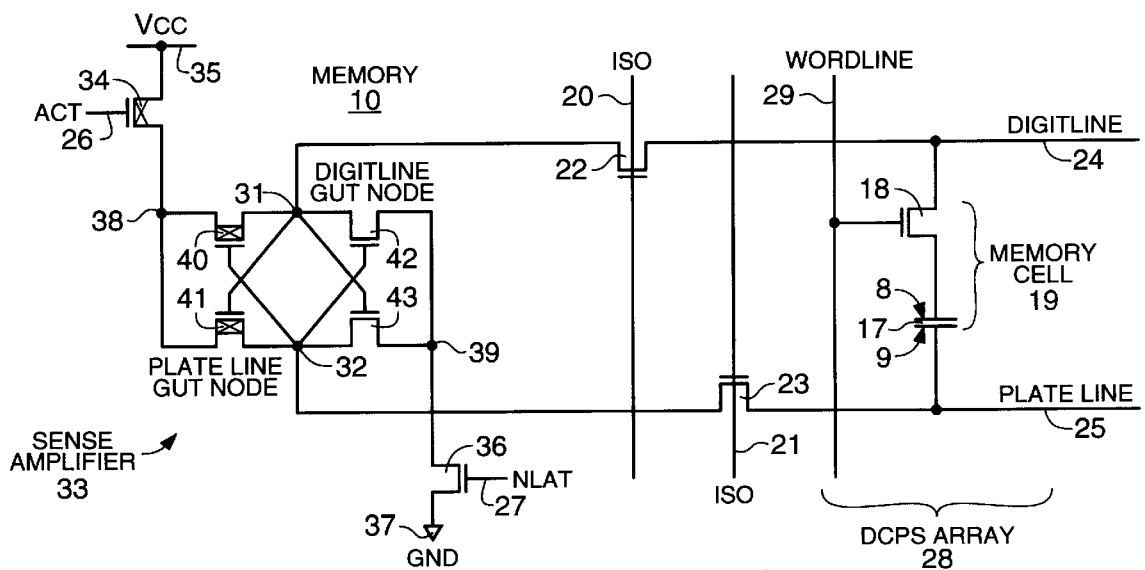
FIG. 1B is a schematic diagram of an exemplary portion of the memory of FIG. 1A.

Referring to FIG. 1A, there is shown a block diagram of an exemplary portion of an embodiment of memory 10 of the prior art. Memory 10 comprises a plurality of sense amplifiers 33, pairs of isolation transistors 22 and 23, and DCPS arrays or subarrays 28. In FIG. 1B, there is shown a schematic diagram of an exemplary portion of memory 10 comprising sense amplifier 33, isolation transistors 22 and 23, and DCPS array 28. Array 28 includes at least one and preferably more than one memory cell 19. Each memory cell 19 comprises transistor 18 and capacitor 17. A gate terminal of transistor 18 is connected to wordline 29. A source/drain terminal of transistor 18 is connected to digitline 24, and another source/drain terminal of transistor 18 is connected to capacitor 17. Capacitor 17 is connected to plate line 25.

Sense amplifier 33 is coupled to digitline 24 and plate line 25 through isolation transistors 22 and 23, respectively. Sense amplifier 33 is connected to a source/drain terminal of each of isolation transistors 22 and 23 at digitline gut node 31 and plate line gut node 32, respectively. Sense amplifier 33 comprises transistors 40 through 43, which are connected at digitline gut node 31 and plate line gut node 32 to form cross-coupled inverters. Thus, sense amplifier 33 forms a latch, and isolation transistors 22 and 23, respectively, are in series between sense amplifier 33 and cell 19.

Sense amplifier 33 is connected at node 38 to a source/drain terminal of voltage pull up transistor 34. Another source/drain terminal of transistor 34 is connected to a logic high level voltage source, which in this embodiment is Vcc 35. Sense amplifier 33 is connected at node 39 to a source/drain terminal of voltage pull down transistor 36. Another source/drain terminal of transistor 36 is connected to a logic low level voltage source, which in this embodiment is ground 37. Conventional details with respect to sense amplifier 33 and DCPS array 10 have been omitted in order to more clearly describe the present invention.

Figure 2:
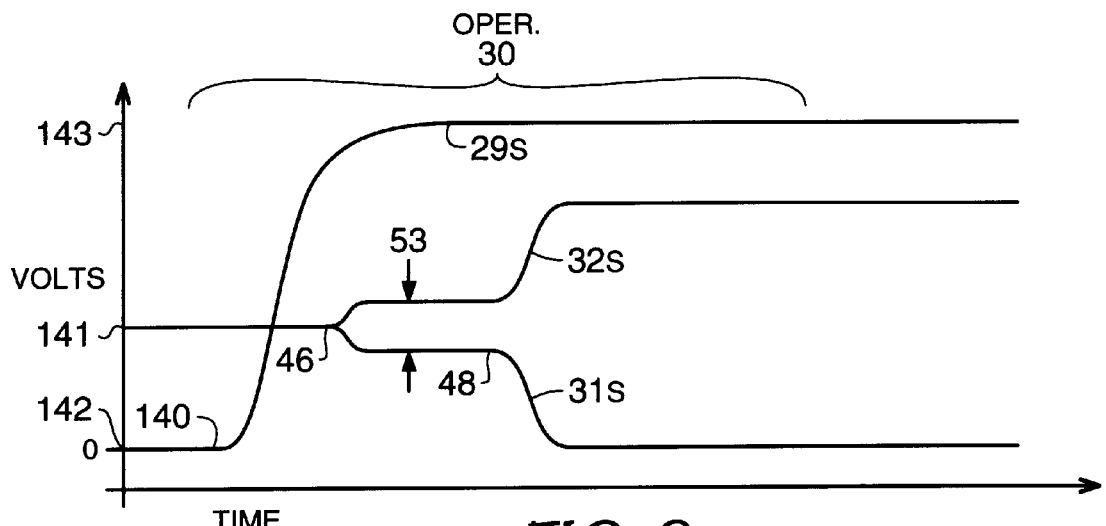
FIGS. 2 and 3 are waveform diagrams for a cell margin test operation on the array of FIG. 1B prior to the present invention.
Figure 3:
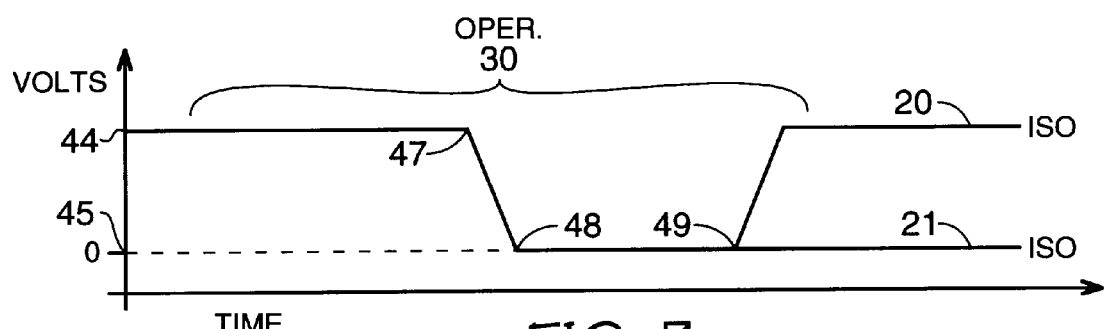

With continuing reference to FIG. 1B, and additional reference to FIGS. 2 and 3 where there are shown waveform diagrams for a cell margin test operation 30 of the prior art, cell margin testing of the prior art is described. At time 140, wordline signal 29S begins to transition from inactive (logic low 142) to active (logic high 143) to turn on transistor 18. Digitline 24 and plate line 25 have previously been conditioned and allowed to float at a predetermined potential level ("precharge", "equilibrate", "intermediate", or "reference" voltage) 141.

Activating transistor 18 allows charge on capacitor 17 to move voltage on digitline 24 and plate line 25 away from potential 141. As isolation (ISO) signals 20 and 21 are active (logic high 44), both isolation transistor 22 and 23 are active. Consequently, charge is transferred from digitline 24 and plate line 25 to digitline gut node 31 and plate line gut node 32, respectively. This charge transfer is graphically depicted as a separation beginning at time 46 of signals 31S and 32S at gut nodes 31 and 32, respectively. This illustrates reading a stored logic low state from cell 19. However, it should be appreciated by one of ordinary skill in the art that signals 31S and 32S would have transitioned in opposite directions as those illustratively shown in FIG. 2 had a logic high state been read from cell 19. Also, it should be appreciated that there are some RC (resistance-capacitance) time delays for wordline 29 transitioning and charge transfer from memory cell 19 to sense amplifier 33.

After wordline 29 transitions, namely at time 47, ISO signals 20 and 21 begin to transition toward voltage level 45 to turn off transistors 22 and 23, respectively. Alternatively, after wordline 29 transistions and charge is transferred from cell 19, both transistors 22 and 23 may be left active for sensing operations.

At or about time 48, transistors 22 and 23 are turned off and sense amplifier 33 begins latching signals 31S and 32S initially using a difference in voltage, namely, voltage difference 53 between signals 31S and 32S. Sense amplifier 33, and ACT signal 26 and NLAT signal 27 to transistors 34 and 36, respectively, drive signals 31S and 32S apart or to opposing voltages levels. At time 49, ISO signal 20 begins to transition from logic level 45 to logic level 44 to activate transistor 22. Once activated, transistor 22 conducts voltage from node 31 onto digitline 24 which may be used to write or restore information back to cell 19.

Figure 4:
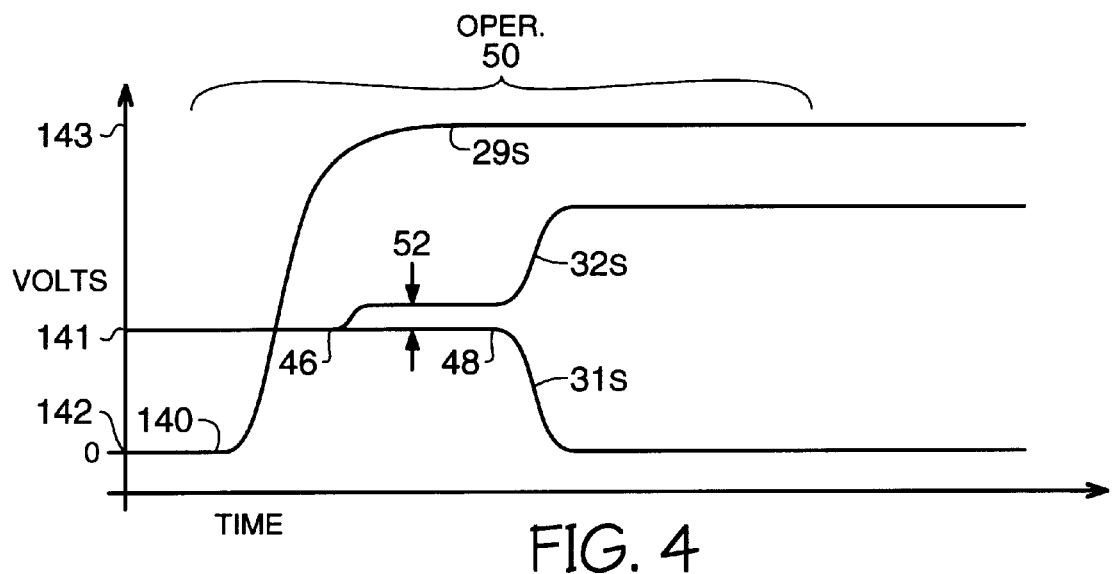
FIGS. 4 and 5 are waveform diagrams for a cell margin test operation on the array of FIG. 1B in accordance with the present invention.
Figure 5:
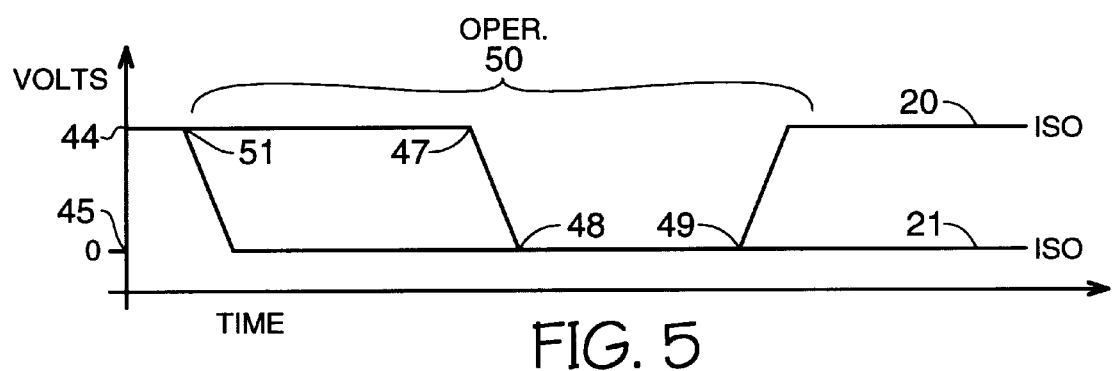

With continuing reference to FIG. 1B, and additional reference to FIGS. 4 and 5 where there are shown waveform diagrams for cell margin test operation 50 in accordance with the present invention, a method of cell margin testing of the present invention is described. For purpose of clarity, only differences between operation 30 (illustratively shown in FIGS. 2 and 3) and operation 50 are described.

In accordance with the present invention, at time 51, which is prior to wordline 29 firing time 140, either ISO signal 20 or 21 begins to transition from active (logic high 44) to inactive (logic low 45). Alternatively, ISO signal 21 may transition at time 51 and ISO signal 20 may transition at time 47. Also, alternatively, at time 47, the transistor, either transistor 22 or 23 in this embodiment, which is still active may be left active for sensing operation (i.e., left on during latching of sense amplifier 33).

Signal 20 transitions at time 51, which is prior to movement of signals 31S and 32S away from precharge voltage 141. In other words, prior to transfer of charge from digitline 24 and plate line 25 onto nodes 31 and 32, respectively, ISO signal 20 begins to deactivate isolation transistor 22. Consequently, later at time 46, charge from memory cell 19 is transferred from plate line 25 to plate line gut node 32 as isolation transistor 23 is on, but not from digitline 24 to digitline gut node 31 as isolation transistor 22 is off. This charge transfer is graphically depicted as a separation beginning at time 46 of signal 32S from signal 31S, the latter signal of which is at or about a precharge or equilibrate voltage level 141. This separation results in voltage difference 52.

Later, at time 48, when isolation transistor 23 is turned off and sense amplifier 33 is employed to drive signals 31S and 32S apart, voltage difference 52 is sensed during the latching of amplifier 33. Voltage difference 52 is less than voltage difference 53 (shown in FIG. 2) of the prior art. In other words, a voltage swing on only one line is used. Because voltage difference 52 is less than voltage difference 53 (about half as large as voltage difference 53 in this embodiment), it makes effective operation of sense amplifier 33 more difficult. This phenomena, however, may then be used for testing sense amplifier operation or cell margin testing for a DCPS array of memory cells. Moreover, this test more closely correlates with test data from a non-DCPS array of memory cells. As in testing a non-DCPS array of memory cells, voltage split is between an accessed digitline voltage and a digitline floating at an equilibrate potential.

The present invention may be employed in a variety of devices other than memories, such devices including but not limited to application specific integrated circuits, microprocessors, microcontrollers, digital signal processors, and the like incorporating a DCPS memory array. Moreover, such devices or a memory or memory module in accordance with the present invention may be employed in various types of information handling systems, including but not limited to network cards, telephones, scanners, facsimile machines, routers, televisions, video cassette recorders, copy machines, displays, printers, calculators, and personal computers, and like systems incorporating memory.

The present invention has been particularly shown and described with respect to certain preferred embodiment(s). It should be readily apparent to those of ordinary skill in the art that various changes and modifications in form and detail may be made without departing from the spirit and scope of the present invention as set forth in the amended claims.

What is claimed is:

1. A method for testing cell margin of a memory integrated circuit, comprising:

providing an array of memory cells, said array of memory cells including a digitline, a plate line, and a wordline operatively coupled to a memory cell of said array of memory cells;

providing a sense amplifier operatively coupled to said digitline and said plate line;

electrically isolating one of said plate line and said digitline from said sense amplifier;

activating said wordline;

providing voltage movement from said array of memory cells to said sense amplifier via the one of said plate line or said digitline not electrically isolated therefrom; and latching said sense amplifier.

2. A method for testing cell margin, comprising:

providing an array of memory cells including at least one digitline and plate line pair, and including at least one wordline;

providing a latch operatively coupled to said at least one digitline and plate line pair;

electrically isolating a line of said at least one digitline and plate line pair from said latch;

activating said at least one wordline to access a memory cell of said array of memory cells operatively coupled to both lines of said at least one digitline and plate line pair;

developing a voltage differential across said latch in response to said activation; and latching said latch.

3. A method for testing cell margin of a memory cell in a dynamic cell plate configured array of memory cells, comprising providing a plateline;

providing a digitline;

conditioning said plate line and said digitline to a reference potential;

electrically isolating a sense amplifier from either said plate line or said digitline of said memory cell;

activating a wordline to access said memory cell to transfer charge to said sense amplifier;

developing a voltage differential across said sense amplifier in response to said access of said memory cell; and latching said sense amplifier.

4. A method for testing cell margin of a memory cell in a dynamic cell plate configured array of memory cells operatively coupled to a plurality of sense amplifiers, comprising:

providing a plate line;

providing a digitline;

conditioning said digitline and said plate line to a voltage level;

electrically isolating a sense amplifier from either said plate line or said digitline of said memory cell;

activating a wordline to access said memory cell to transfer charge from said memory cell to said sense amplifier on either said plate line or said digitline not electrically isolated from said sense amplifier;

developing a voltage differential across said sense amplifier in response to said charge transfer; and latching said sense amplifier.

5. A method for testing cell margin of a memory device, comprising:

providing an array of memory cells, said array of memory cells including a digitline, a wordline, and a plate line operatively coupled to a memory cell of said array of memory cells;

providing a sense amplifier operatively coupled to said digitline and said plate line;

providing a first transistor operatively coupled between said digitline and said sense amplifier;

providing a second transistor operatively coupled between said plate line and said sense amplifier;

floating said plate line and said digitline at an intermediate voltage level;

electrically isolating either said digitline or said plate line from said sense amplifier by respectively deactivating either said first transistor or said second transistor;

activating said wordline operatively coupled to said memory cell of said array of memory cells;

providing voltage movement to said sense amplifier from said memory cell via one of said plate line or said digitline not electrically isolated therefrom; and latching said sense amplifier.

6. A method for testing cell margin of a memory device, comprising:

providing a dynamic cell plate-configured array of memory cells, said dynamic cell plate-configured array of memory cells including a digitline, a wordline, and a plate line operatively coupled to a memory cell of said dynamic cell plate-configured array of memory cells;

providing a sense amplifier operatively coupled to said digitline and said plate line;

providing a first transistor operatively coupled between said digitline and said sense amplifier;

providing a second transistor operatively coupled between said plate line and said sense amplifier;

floating said plate line and said digitline at a precharge voltage level;

electrically isolating said digitline from said sense amplifier by deactivating said first transistor;

activating said wordline operatively coupled to said memory cell;

providing voltage movement to said sense amplifier from said memory cell via said plate line;

after said voltage movement is provided to said sense amplifier, electrically isolating said plate line from said sense amplifier by deactivating said second transistor; and driving said sense amplifier to opposite voltage levels.

7. A method for testing cell margin of a memory device, comprising:

providing an array of memory cells, said array of memory cells including a digitline, a wordline, and a plate line operatively coupled to a memory cell of said array of memory cells;

providing a sense amplifier operatively coupled to said digitline and said plate line;

providing a first transistor operatively coupled between said digitline and said sense amplifier;

providing a second transistor operatively coupled between said plate line and said sense amplifier;

floating said plate line and said digitline at an equilabrate voltage level;

electrically isolating said plate line from said sense amplifier by deactivating said second transistor;

activating said wordline operatively coupled to said memory cell of said array of memory cells;

providing voltage movement to said sense amplifier from said memory cell via said digitline; and after said voltage movement is provided to said sense amplifier, electrically isolating said digitline from said sense amplifier by deactivating said first transistor; and driving said sense amplifier to opposite voltage levels.

8. A method for testing cell margin of a memory device, comprising:

providing a memory array, said memory array having a memory cell, a memory cell activation line, a first memory cell access line, and a second memory cell access line;

providing a sense amplifier;

conditioning said first memory cell access line and said second memory cell access line to a reference potential;

electrically isolating said first memory cell access line from said sense amplifier;

activating said memory cell activation line;

in response to said activation:

providing first voltage movement on said first memory cell access line, said first voltage movement in a first direction away from said reference potential;

providing second voltage movement on said second memory cell access line, said second voltage movement in a second direction, different from said first direction, away from said reference potential; and latching said sense amplifier, said sense amplifier sensing said second voltage movement for said latching.

9. A method, as in claim 8, wherein said memory cell activation line is a wordline.

10. A method, as in claim 8, wherein said first memory cell access line is a digitline, and said second memory cell access line is a plate line.

11. A method, as in claim 8, wherein said second memory cell access line is a digitline, and said first memory cell access line is a plate line.

12. A method for providing different voltage swings, one for an operation mode and another for a test mode, in a memory device, comprising:

providing a memory array, said memory array having a memory cell, a memory cell activation line, a first memory cell access line, and a second memory cell access line;

providing a sense amplifier;

conditioning said first memory cell access line and said second memory cell access line to a reference potential;

activating said memory cell activation line;

in response to said activation:

providing first voltage movement on said first memory cell access line, said first voltage movement in a first direction away from said reference potential;

providing second voltage movement on said second memory cell access line, said second voltage movement in a second direction, different from said first direction, away from said reference potential;

providing a first voltage swing to said sense amplifier in said operation mode, said first voltage swing a combination of said first voltage movement and said second voltage movement;

providing a second voltage swing to said sense amplifier in said test mode in part by, selectively isolating either said first memory cell access line or said second memory access line, respectively, from said sense amplifier prior to said activation of said memory cell activation line; and said second voltage swing comprising either said first voltage movement or said second voltage movement.

13. A method, as in claim 12, wherein said memory cell activation line is a wordline.

14. A method, as in claim 12, wherein said first memory cell access line is a digitline, and said second memory cell access line is a plate line.

15. A method, as in claim 12, wherein said second memory cell access line is a digitline, and said first memory cell access line is a plate line.

16. A method for testing cell margin of a memory integrated circuit having an array of memory cells, said array of memory cells including a digitline, a plate line, and a wordline operatively coupled to a memory cell of said array of memory cells, and including a sense amplifier operatively coupled to said digitline and said plate line, said method comprising:

electrically isolating one of said plate line and said digitline from said sense amplifier;

activating said wordline;

providing voltage movement from said array of memory cells to said sense amplifier via the one of said plate line or said digitline not electrically isolated therefrom; and latching said sense amplifier.

17. A method for testing cell margin in a dynamic cell plate sensing array having a digitline, a plate line, and a voltage differential triggered latch, said voltage differential triggered latch operatively coupled to said digitline and said plate line, said method comprising:

electrically isolating one of said plate line and said digitline from said voltage differential triggered latch;

initiating a voltage differential on either said plate line or said digitline;

providing said voltage differential to said voltage differential triggered latch; and latching said voltage differential triggered latch.

18. A method, as in claim 17, wherein said dynamic cell plate sensing array comprises a memory cell operatively coupled to said plate line and to said digitline.

19. A method, as in claim 18, wherein said memory cell is operatively coupled to a wordline.

20. A method, as in claim 19, wherein said voltage differential triggered latch is a sense amplifier.

* * * * *